US007541250B2

(12) United States Patent
Miller, Jr. et al.

(10) Patent No.: US 7,541,250 B2
(45) Date of Patent: Jun. 2, 2009

(54) METHOD FOR FORMING A SELF-ALIGNED TWIN WELL REGION WITH SIMPLIFIED PROCESSING

(75) Inventors: Gayle W. Miller, Jr., Colorado Springs, CO (US); Bryan D. Sendelweck, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 382 days.

(21) Appl. No.: 11/371,258

(22) Filed: Mar. 7, 2006

(65) Prior Publication Data

US 2007/0212840 A1    Sep. 13, 2007

(51) Int. Cl.
    *H01L 21/20*    (2006.01)
(52) U.S. Cl. .............. 438/365; 438/322; 438/327; 438/370; 438/373; 438/375; 257/E21.461; 257/E21.476; 257/E21.612; 257/E29.345; 257/E33.005; 257/E33.012; 257/E33.019; 257/E33.063
(58) Field of Classification Search ............ 438/228, 438/299, 451, 527, 420, 224, 232, 322, 327, 438/365, 370, 372, 373, 375, 376, 377; 257/E21.644, 257/E27.067, 371, E21.612, 461, 476, E29.345, 257/E33.005, E33.012, E33.019, E33.063
See application file for complete search history.

(56) References Cited

U.S. PATENT DOCUMENTS

| 3,867,203 | A | * | 2/1975 | Gesing et al. | 438/10 |
| 4,599,789 | A | | 7/1986 | Gasner | 29/571 |
| 4,728,619 | A | * | 3/1988 | Pfiester et al. | 438/451 |
| 4,889,825 | A | | 12/1989 | Parrillo | 437/34 |
| 4,929,565 | A | | 5/1990 | Parrillo | 437/34 |
| 5,407,847 | A | * | 4/1995 | Hayden et al. | 438/305 |
| 5,420,051 | A | * | 5/1995 | Bohr et al. | 438/365 |
| 5,548,137 | A | * | 8/1996 | Fan et al. | 257/191 |
| 5,627,099 | A | * | 5/1997 | Sasaki | 438/488 |
| 5,885,880 | A | * | 3/1999 | Gomi | 438/322 |
| 5,965,928 | A | * | 10/1999 | Nagura | 257/532 |
| 6,133,081 | A | | 10/2000 | Kim | 438/227 |
| 6,211,002 | B1 | | 4/2001 | Wu | 438/223 |
| 6,348,371 | B1 | | 2/2002 | Huang et al. | 438/218 |

OTHER PUBLICATIONS

Karl Wimmer, Dissertation: Two-Dimensional Nonplanar Process Simulation (Chapter 2.5.2 Knock-in Implantation—A Feasibility Study for the Production of Ultra Shallow Profiles), Oct. 19, 1994.*

* cited by examiner

*Primary Examiner*—Michael S Lebentritt
(74) *Attorney, Agent, or Firm*—Schwegman, Lundberg & Woessner P.A.

(57) ABSTRACT

A method for forming a self-aligned twin well region is provided. The method includes implanting a first well type doping species into the DHL such that its distribution remains stopped in the DHL above the silicon substrate, etching away a portion of the DHL using a photoresist mask, implanting a second well type doping species into the portions of the silicon substrate exposed by the etching, and moving a portion of the first well type doping species into the silicon substrate.

12 Claims, 6 Drawing Sheets

METHOD FOR FORMING A SELF-ALIGNED TWIN WELL REGION WITH SIMPLIFIED PROCESSING

FIELD OF THE INVENTION

The present invention relates to the formation of twin well regions in semiconductor processing, and more particularly to the simplification of process for formation of twin well regions.

BACKGROUND OF THE INVENTION

Conventional processes for forming twin well regions in semiconductor wafers are generally costly. Separate masking and implant steps are typically used for the formation of each well type. In addition, using conventional processes, formation of a large surface step artifact at the well boundaries typically occurs, which artifact can result in a non-planar silicon substrate surface. FIGS. 3A through 3E illustrate a conventional method for forming a self-aligned twin well region. As illustrated in FIG. 3A, first, a silicon dioxide pad 301 is grown, and a silicon nitride layer 302 is then deposited. A photoresist mask 303 is then exposed, developed, and baked. The silicon nitride layer 302 is then etched, stopping at the silicon dioxide pad 301. As illustrated in FIG. 3B, next, the photoresist mask 303 is removed, and another photoresist mask 304 is exposed, developed, and baked. An ion implant of an n-type doping species is then performed on the unmasked portions of the silicon dioxide pad 301. As illustrated in FIG. 3C, the photoresist mask 304 is removed, and a layer of thermal oxide 305 is then grown, masked by the silicon nitride 302. As illustrated in FIG. 3D, the silicon nitride layer 302 is removed, and an ion implant of a p-type doping species is then performed. As illustrated in FIG. 3E, the silicon nitride layer 302 is then removed, and an oxide pad 306 is grown.

However, the twin-well region (comprising the NWELL and the PWELL) includes a permanent step height 307 at the well boundary, resulting in a non-planar surface. The non-planar surface can create major problems when shallow trench isolation is used on this surface. The difficulty is much greater when there is also a deep trench to be filled and planarized, as in the SMART-IS technologies, which use dual trench isolation. In addition to this, the active devices then lie at two separate optimum focus heights on the surface (the NMOS are in the PWELL, elevated above the surface of the NWELL which contains the PMOS devices). This complicates the lithography and makes the gate features difficult to pattern simultaneously.

Accordingly, there exists a need for a method for simplified processing for forming self-aligned twin well regions. The method should reduce the processing cost of forming twin well regions and substantially eliminate the large surface step artifact problem. The present invention addresses such a need.

SUMMARY OF THE INVENTION

A method for forming a self-aligned twin well region is disclosed. The method includes implanting a first well type doping species into the DHL such that its distribution remains stopped in the DHL above the silicon substrate, etching away a portion of the DHL using a photoresist mask, implanting a second well type doping species into the portions of the silicon substrate exposed by the etching, and moving a portion of the first well type doping species into the silicon substrate. By using fewer steps than conventional methods, the processing costs of forming a twin well region is reduced. The large surface step artifact problem is also substantially eliminated.

DETAILED DESCRIPTION

The present invention provides a method for forming a self-aligned twin well region. The following description is presented to enable one of ordinary skill in the art to make and use the invention and is provided in the context of a patent application and its requirements. Various modifications to the implementations provided below will be readily apparent to those skilled in the art and the generic principles herein may be applied to other implementations. Thus, the present invention is not intended to be limited to the implementations shown but is to be accorded the widest scope consistent with the principles and features described herein.

To more particularly describe the features of the present invention, please refer to FIGS. 1 through 3E in conjunction with the discussion below.

Figure 1:
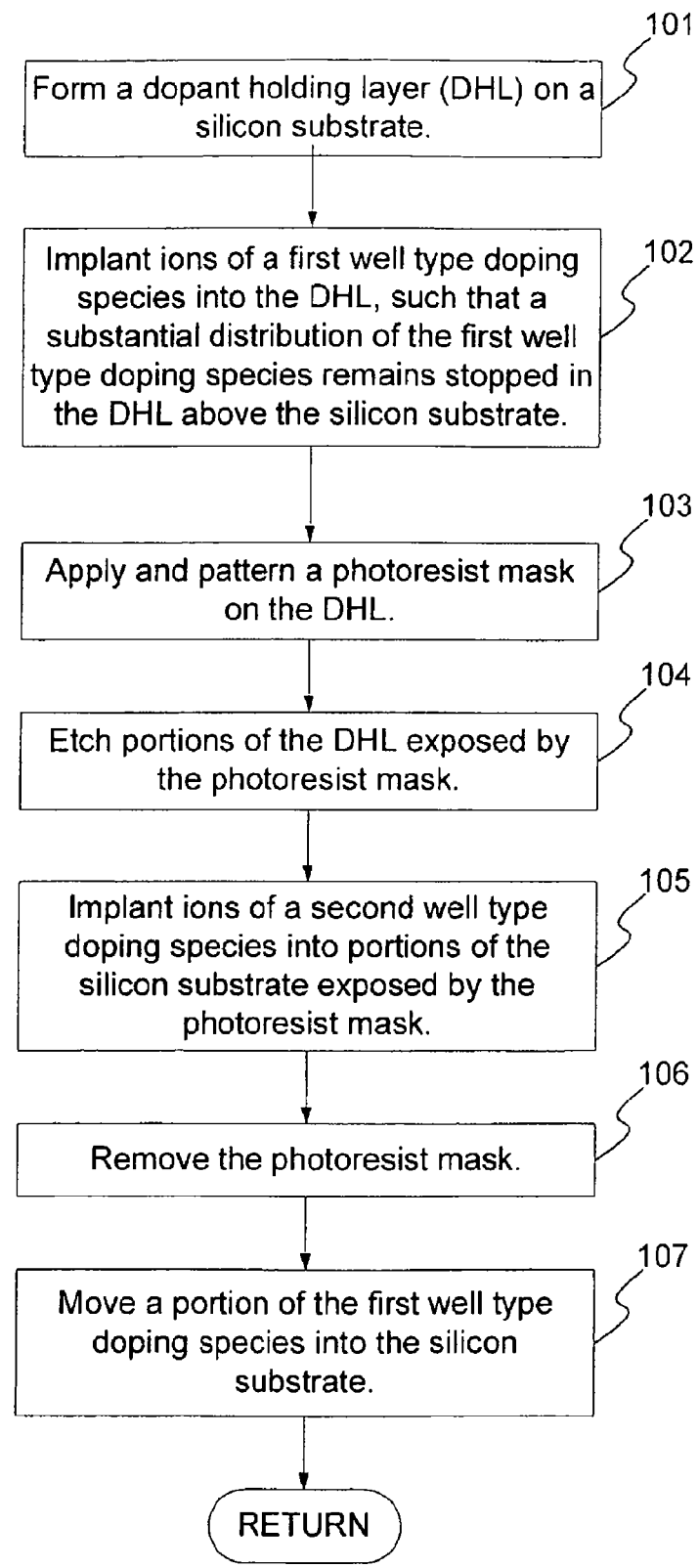
FIG. 1 is a flowchart illustrating one implementation of a method for forming a self-aligned twin well region in accordance with the present invention.
Figure 2A:
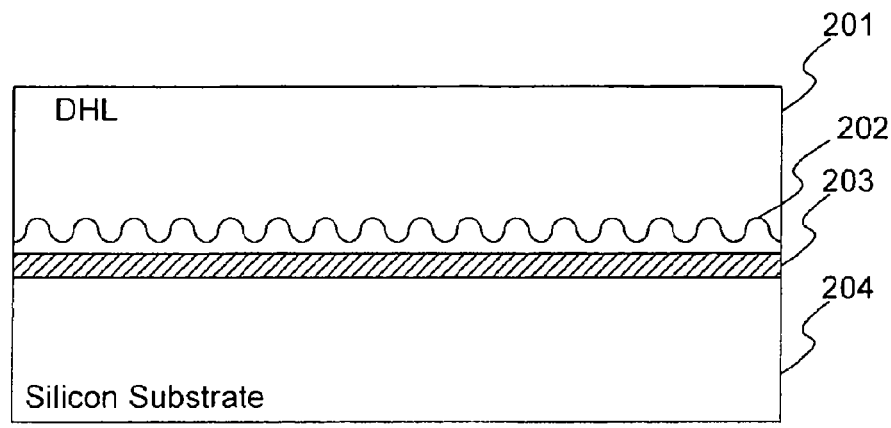
FIGS. 2A through 2C are block diagrams illustrating the method of FIG. 1 in accordance with the present invention.
Figure 2B:
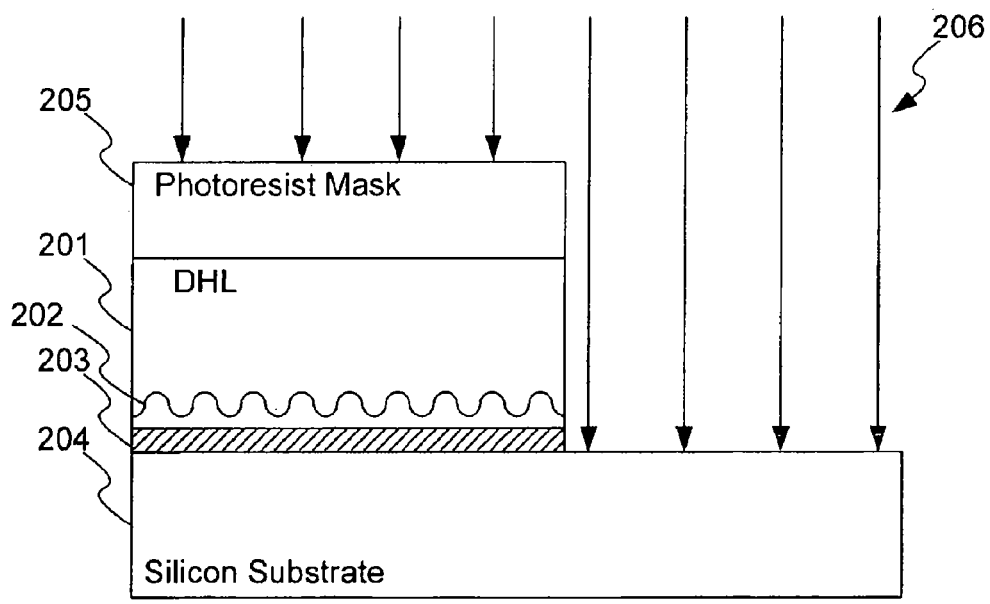
Figure 2C:
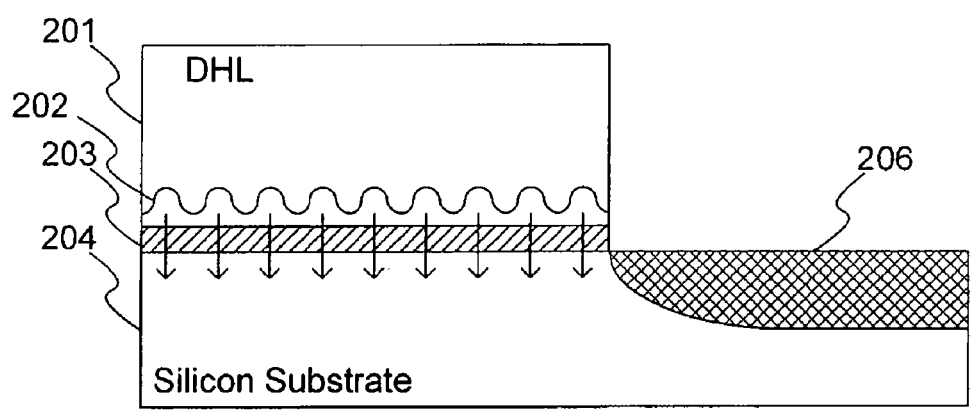
Figure 3A:
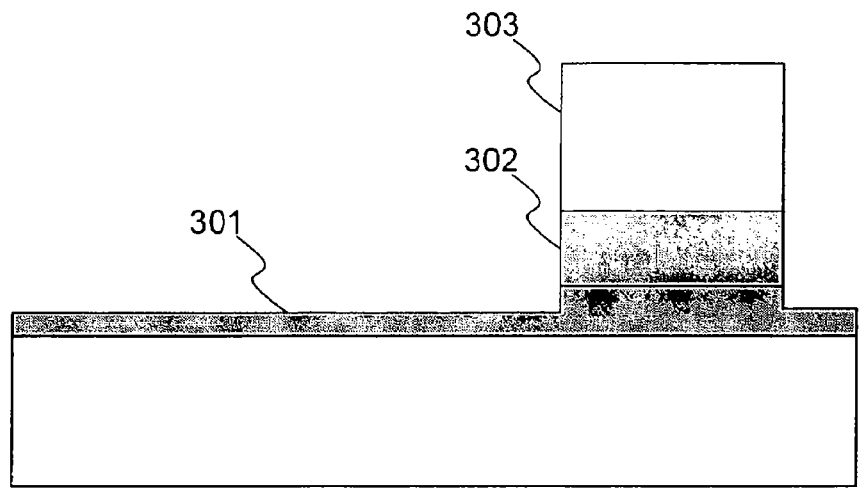
FIGS. 3A through 3E are block diagrams illustrating a conventional method for self-aligned twin well region.
Figure 3B:
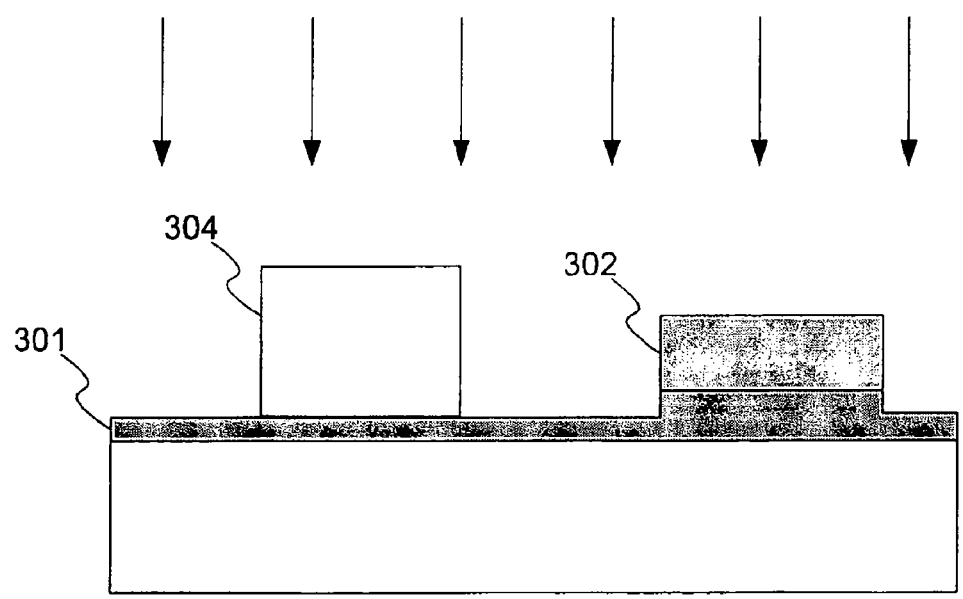
Figure 3C:
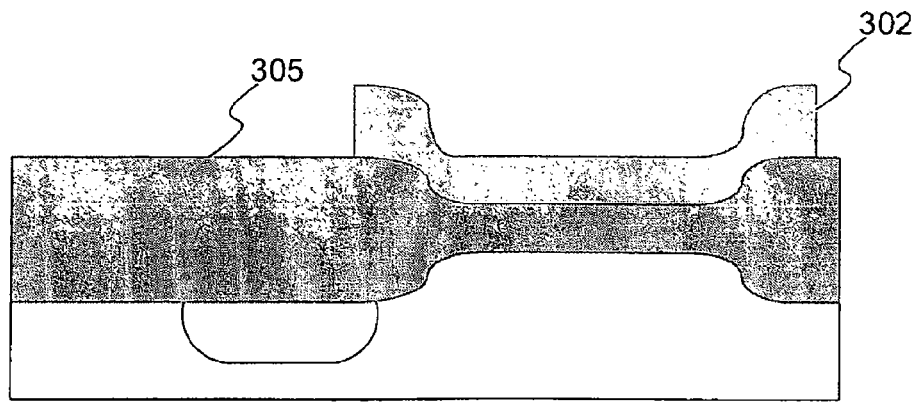
Figure 3D:
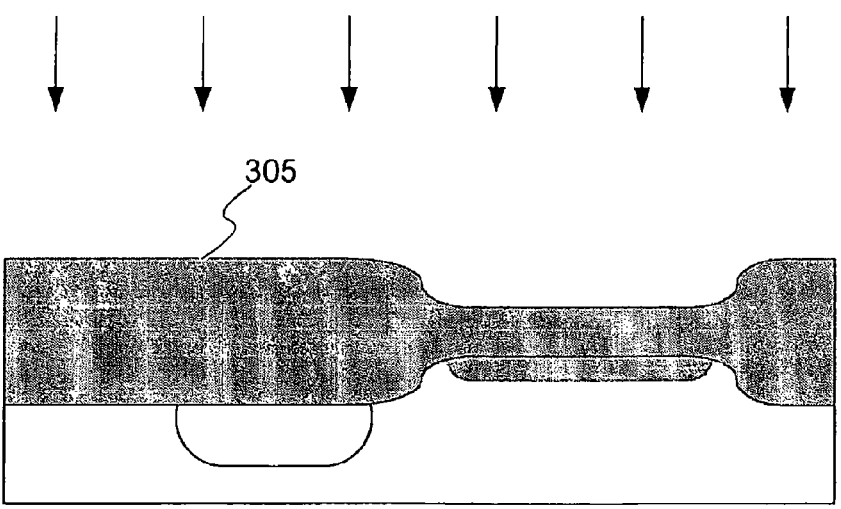
Figure 3E:
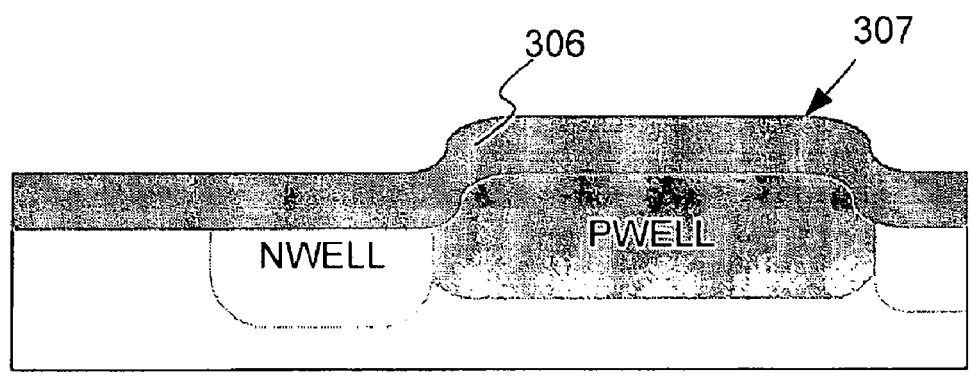

FIG. 1 is a flowchart illustrating one implementation of a method for forming a self-aligned twin well region in accordance with the present invention. FIGS. 2A through 2C are block diagrams illustrating the method in accordance with the present invention. As illustrated in FIG. 2A, first, a dopant holding layer (DHL) 201 is formed on a silicon substrate 204, via step 101. The DHL 201 can be composed of polysilicon, silicon oxide, or any other similar material. Next, ions of a first well type doping species 202 are implanted into the DHL 201, such that (in one implementation) a substantial distribution of the first well type doping species 202 remains stopped in the DHL 201 above the silicon substrate 204. Optionally, a transmission layer 203 could be physically part of and have the same initial composition as the DHL 201. In one implementation, this implant is an unmasked blanket implant.

As illustrated in FIG. 2B, a photoresist mask 205 is next patterned and applied on the DHL 201, via step 103. Portions of the DHL 201 exposed by the photoresist mask are then etched away, via step 104. The etching can be a dry or wet etch. Next, ions of a second well type doping species 206 are implanted into portions of the silicon substrate 204 exposed by the etching, via step 105. The second well type doping species 206 selected can be a complementary type to the first well type doping species 202. The photoresist mask 205 is then removed, via step 106. Any conventional method of removing a photoresist mask can be used.

As illustrated in FIG. 2C, a portion of the first well type doping species 202 is then moved into the silicon substrate 204, via step 107. In one implementation, the movement is accomplished by thermally diffusing and redistribution the first well type doping species 202 into the silicon substrate 204. Alternatively, a blanket silicon (or other species) ion implantation can be performed into the surface of the DHL 201 to causes a "knock-on" implantation of the first well type doping species 202. If this method is desired, use of phosphorous for the first well doping species can be used. This implant can be a masked implant if three well types are desired. This implant can also be preceded by a silicon oxidation step. The resulting oxide grown would reduce the interaction of the blanket silicon implant with the exposed silicon substrate 204 with the second well type doping species 206.

If the blanket silicon ion implantation is used, the resulting structure includes a transmission layer 203 of approximately 15-50 Å±-2Å of $SiO_2$, and a DHL 201 of approximately 200 to 1000 Å of α-silicon (or amorphous silicon) or polysilicon. The first well type doping species 202 is boron in the form of $BF_2$ implanted into the α-silicon at approximately 15 keV with a dose of 1E13-5E15. Optionally, 25 keV with a dose of 2E14 to 2E15 can be used to "knock on" the implanted phosphorous into the silicon substrate 204 through the transmission layer 203.

A method for forming a self-aligned twin well region as been disclosed. The method includes implanting a first well type doping species into the DHL such that its distribution remains stopped in the DHL above the silicon substrate, etching away a portion of the DHL using a photoresist mask, implanting a second well type doping species into the portions of the silicon substrate exposed by the etching, and moving a portion of the first well type doping species into the silicon substrate. By using fewer steps than conventional methods, the processing costs of forming a twin well region are reduced. In addition, the large surface step artifact problem is also substantially eliminated.

Although the present invention has been described in accordance with the embodiments shown, one of ordinary skill in the art will readily recognize that there could be variations to implementations discussed above and those variations would be within the scope of the present invention. Accordingly, many modifications may be made without departing from the scope of the appended claims.

What is claimed is:

1. A method for forming a self-aligned twin well region in semiconductor processing, the method comprising:
   forming a dopant holding layer on a silicon substrate;
   implanting ions of a first well type doping species into the dopant holding layer, such that a substantial distribution of the first well type doping species remains stopped in the dopant holding layer above the silicon substrate;
   applying and patterning a photoresist mask on the dopant holding layer;
   etching portions of the dopant holding layer exposed by the photoresist mask;
   implanting ions of a second well type doping species into portions of the silicon substrate exposed by the etching;
   removing the photoresist mask; and
   moving a portion of the first well type doping species into the silicon substrate.

2. The method of claim 1, wherein the dopant holding layer comprises a transmission layer, wherein the ions of the first well type doping species are implanted such that the substantial distribution of the first well type doping species remains stopped at the transmission layer.

3. The method of claim 1, wherein the implanting ions includes using an unmasked blanket implant.

4. The method of claim 1, wherein moving a portion of the first well type doping species includes thermally diffusing and redistributing the first well type doping species into the silicon substrate.

5. The method of claim 1, wherein the moving a portion of the first well type doping species includes:
   performing a blanket knock-on ion implantation into a surface of the dopant holding layer.

6. A method for forming a self-aligned twin well region in semiconductor processing, the method comprising:
   forming a dopant holding layer on a silicon substrate;
   performing an unmasked blanket implantation of ions of a first well type doping species into the dopant holding layer, such that a substantial distribution of the first well type doping species remains stopped in the dopant holding layer above the silicon substrate;
   applying and patterning a photoresist mask on the dopant holding layer;
   etching portions of the dopant holding layer exposed by the photoresist mask;
   implanting ions of a second well type doping species into portions of the silicon substrate exposed by the etching;
   removing the photoresist mask; and
   thermally diffusing and redistributing the first well type doping species into the silicon substrate.

7. The method of claim 6, wherein forming a dopant holding layer includes forming a transmission layer, and wherein performing an unmasked blanket implantation of ions of a first well type doping species includes implanting ions of the first well type doping species such that the substantial distribution of the first well type doping species remains stopped at the transmission layer.

8. The method of claim 7, wherein moving a portion of the first well type doping species includes performing a blanket knock-on ion implantation into a surface of the dopant holding layer.

9. The method of claim 8, wherein forming a dopant holding layer includes forming a an oxide on the silicon substrate.

10. The method of claim 1, wherein forming a dopant holding layer includes forming a an oxide on the silicon substrate.

11. The method of claim 1, wherein implanting ions of a first well type doping species includes implanting boron.

12. The method of claim 11, wherein implanting ions of a first well type doping species includes implanting $BF_2$ implanted into the α-silicon at approximately 15 keV with a dose of 1E13-5E15.

* * * * *